US012812804B2

(12) United States Patent
Park et al.

(10) Patent No.: US 12,812,804 B2
(45) Date of Patent: Nov. 24, 2026

(54) WEARABLE ELECTRONIC DEVICE

(71) Applicant: Samsung Electronics Co., Ltd., Suwon-si (KR)

(72) Inventors: Chungsoon Park, Suwon-si (KR); Jeongho Ahn, Suwon-si (KR); Bareum Park, Suwon-si (KR); Yangji Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 295 days.

(21) Appl. No.: 18/443,913

(22) Filed: Feb. 16, 2024

(65) Prior Publication Data

US 2024/0284621 A1 Aug. 22, 2024

Related U.S. Application Data

(63) Continuation of application No. PCT/KR2024/002138, filed on Feb. 16, 2024.

(30) Foreign Application Priority Data

Feb. 16, 2023 (KR) ........................ 10-2023-0020641
Mar. 31, 2023 (KR) ........................ 10-2023-0042796

(51) Int. Cl.
*H05K 5/02* (2006.01)
*H05K 1/02* (2006.01)
(Continued)

(52) U.S. Cl.
CPC ......... *H05K 5/0273* (2013.01); *H05K 1/0219* (2013.01); *H05K 1/111* (2013.01);
(Continued)

(58) Field of Classification Search
CPC .... H05K 5/0273; H05K 1/0219; H05K 1/111; H05K 2201/10371; G04G 17/04;
(Continued)

(56) References Cited

U.S. PATENT DOCUMENTS 10,297,901 B2 5/2019 Zhao et al.
10,355,344 B1 * 7/2019 Ruaro .................... H01Q 1/273
(Continued)

FOREIGN PATENT DOCUMENTS

CN 115348720 11/2022
JP 2012 213030 A 11/2012
(Continued)

OTHER PUBLICATIONS

Search Report and Written Opinion dated May 21, 2024 issued in International Patent Application No. PCT/KR2024/002138.
(Continued)

*Primary Examiner* — Cindy Trandai
(74) *Attorney, Agent, or Firm* — Nixon & Vanderhye P.C.

(57) ABSTRACT

According to an embodiment of the disclosure, an electronic device may include: a housing, a printed circuit board disposed in the housing, the printed circuit board including a wireless communication module comprising communication circuitry, a radio frequency switch, a first electronic component comprising circuitry, and a second electronic component, comprising circuitry, electrically connected to the radio frequency switch, and a shield can disposed on the printed circuit board to cover at least a partial area of the printed circuit board and including multiple pads in contact with the printed circuit board, and an antenna module, comprising at least one antenna, configured to transmit and/or receive signals and/or power between external electronic devices using at least part of the housing and at least part of the shield can, wherein the multiple pads include a first pad electrically connected to the radio frequency switch and a second pad electrically connected to the first electronic component, the multiple pads are configured to be electrically isolated from the printed circuit board, and the radio frequency switch is configured to select one of a first path
(Continued)

configured to cause the antenna module to have a first radiation efficiency based on a signal of a first frequency band provided from the wireless communication module being applied to the first path, and a second path configured to cause the antenna module to have a second radiation efficiency different from the first radiation efficiency based on a signal of the first frequency band being applied to the second path, and is connected to the second electrical component.

20 Claims, 8 Drawing Sheets

(51) Int. Cl.
*H05K 1/11* (2006.01)
*H05K 5/00* (2006.01)

(52) U.S. Cl.
CPC ... *H05K 5/003* (2013.01); *H05K 2201/10037* (2013.01); *H05K 2201/10098* (2013.01)

(58) Field of Classification Search
CPC .......... G04G 21/04; G04G 99/00; G06F 1/16; H01Q 1/273; H01Q 1/44; H01Q 1/526; H01Q 5/328
See application file for complete search history.

(56) References Cited

U.S. PATENT DOCUMENTS

| | | | | |
|---|---|---|---|---|
| 10,484,112 | B2* | 11/2019 | Pascolini | H04B 17/318 |
| 2005/0122268 | A1 | 6/2005 | Suzuki | |
| 2007/0069960 | A1 | 3/2007 | Moon et al. | |
| 2010/0234066 | A1 | 9/2010 | Kobayashi et al. | |
| 2015/0301097 | A1* | 10/2015 | Cho | G01R 31/2817 324/509 |
| 2016/0056535 | A1* | 2/2016 | Sakong | H01Q 1/243 343/845 |
| 2017/0236049 | A1 | 8/2017 | Kato et al. | |
| 2018/0116078 | A1* | 4/2018 | Mun | H10W 42/20 |
| 2018/0227858 | A1* | 8/2018 | Suh | H03H 7/40 |
| 2018/0270997 | A1* | 9/2018 | Lee | H05K 9/0028 |
| 2019/0082562 | A1* | 3/2019 | Mun | H05K 9/0028 |
| 2019/0280375 | A1* | 9/2019 | Ahn | H01Q 1/38 |
| 2019/0357347 | A1* | 11/2019 | Kim | H05K 9/0024 |
| 2020/0091588 | A1 | 3/2020 | Zhao et al. | |
| 2020/0127361 | A1* | 4/2020 | Lee | H05K 1/141 |
| 2020/0367393 | A1* | 11/2020 | Mun | H05K 9/003 |
| 2021/0126340 | A1 | 4/2021 | Niakan | |
| 2021/0336327 | A1* | 10/2021 | Kim | H01Q 1/24 |
| 2022/0077566 | A1* | 3/2022 | Jo | H01Q 21/08 |
| 2022/0286098 | A1* | 9/2022 | Zhao | H03F 3/45188 |
| 2022/0294099 | A1* | 9/2022 | Choi | H04B 1/00 |
| 2022/0322522 | A1* | 10/2022 | Lee | H04M 1/0277 |
| 2023/0247272 | A1* | 8/2023 | Han | H04N 23/55 348/373 |
| 2024/0154310 | A1* | 5/2024 | Li | H01Q 1/44 |
| 2024/0171011 | A1 | 5/2024 | Yoshino et al. | |

FOREIGN PATENT DOCUMENTS

| | | |
|---|---|---|
| JP | 2016-504796 | 2/2016 |
| JP | 2022-156527 | 10/2022 |
| KR | 100699472 B1 | 3/2007 |
| KR | 20100101496 A | 9/2010 |
| KR | 10-2019-0092085 | 8/2019 |
| KR | 10-2021-0015460 | 2/2021 |
| KR | 10-2022-0035757 | 3/2022 |
| KR | 102402271 B1 | 5/2022 |
| KR | 20220157553 A | 11/2022 |

OTHER PUBLICATIONS

Extended European Search Report dated Jan. 26, 2026 for EP Application No. 24757228.2.

* cited by examiner

WEARABLE ELECTRONIC DEVICE

CROSS-REFERENCE TO RELATED APPLICATIONS

This application is a continuation of International Application No. PCT/KR2024/002138 designating the United States, filed on Feb. 16, 2024, in the Korean Intellectual Property Receiving Office and claiming priority to Korean Patent Application Nos. 10-2023-0020641, filed on Feb. 16, 2023, and 10-2023-0042796, filed on Mar. 31, 2023, in the Korean Intellectual Property Office, the disclosures of each of which are incorporated by reference herein in their entireties.

BACKGROUND

Field

An embodiment of the disclosure relates to a wearable electronic device.

Description of Related Art

Due to the remarkable development of information and communication technology and semiconductor technology, the spread and use of various electronic devices are increasing rapidly. In particular, recent electronic devices are being developed to enable communication while being carried.

An electronic device can refer to a device that performs a specific function based on a loaded program, such as a home appliance, an electronic notebook, a portable multimedia player, a mobile communication terminal, a tablet PC, a video/audio device, a desktop/laptop computer, or a vehicle navigation system. For example, these electronic devices may output stored information as sound or video. In recent years, with the increasing integration of electronic devices and the widespread adoption of high-speed and high-capacity wireless communication, various functions can be incorporated in a single electronic device, such as a mobile communication terminal. For example, not only communication functions, but also entertainment functions such as gaming, multimedia functions such as music and video playback, communication and security functions such as mobile banking, or schedule management or electronic wallet functions are integrated into a single electronic device. These electronic devices are being miniaturized so as to be conveniently carried by users.

SUMMARY

According to an example embodiment of the disclosure, an electronic device may include: a housing, a printed circuit board disposed in the housing, the printed circuit board including a wireless communication module including communication circuitry, a radio frequency (RF) switch, a first electronic component comprising circuitry, and a second electronic component comprising circuitry electrically connected to the radio frequency switch, and a shield can disposed on the printed circuit board to cover at least a partial area of the printed circuit board and including multiple pads (SMT PAD) in contact with the printed circuit board, and an antenna module, comprising at least one antenna, configured to transmit and/or receive signals and/or power between external electronic devices using at least part of the housing and at least part of the shield can, wherein the multiple pads include a first pad electrically connected to the radio frequency (RF) switch and a second pad electrically connected to the first electronic component, the multiple pads are configured to be electrically isolated from the printed circuit board, and the radio frequency switch is configured to select one of a first path configured to cause the antenna module to have a first radiation efficiency based on a signal of a first frequency band provided from the wireless communication module being applied to the first path, and a second path configured to cause the antenna module to have a second radiation efficiency different from the first radiation efficiency based on a signal of the first frequency band being applied to the second path, and connected to the second electronic component.

According to an example embodiment of the disclosure, an electronic device may include: a housing, a printed circuit board disposed in the housing, the printed circuit board including a wireless communication module comprising communication circuitry, a radio frequency (RF) switch, a first electronic component comprising circuitry, and a second electronic component comprising circuitry electrically connected to the radio frequency switch, and a shield can disposed on the printed circuit board to cover at least a partial area of the printed circuit board and including multiple pads (SMT PAD) in contact with the printed circuit board, and an antenna module, comprising at least one antenna, configured to transmit and/or receive signals and/or power between external electronic devices using at least part of the housing and at least part of the shield can, wherein the multiple pads include a first pad electrically connected to the radio frequency (RF) switch and a second pad electrically connected to the first electronic component, wherein the multiple pads are electrically isolated from the printed circuit board.

DETAILED DESCRIPTION

Figure 1:
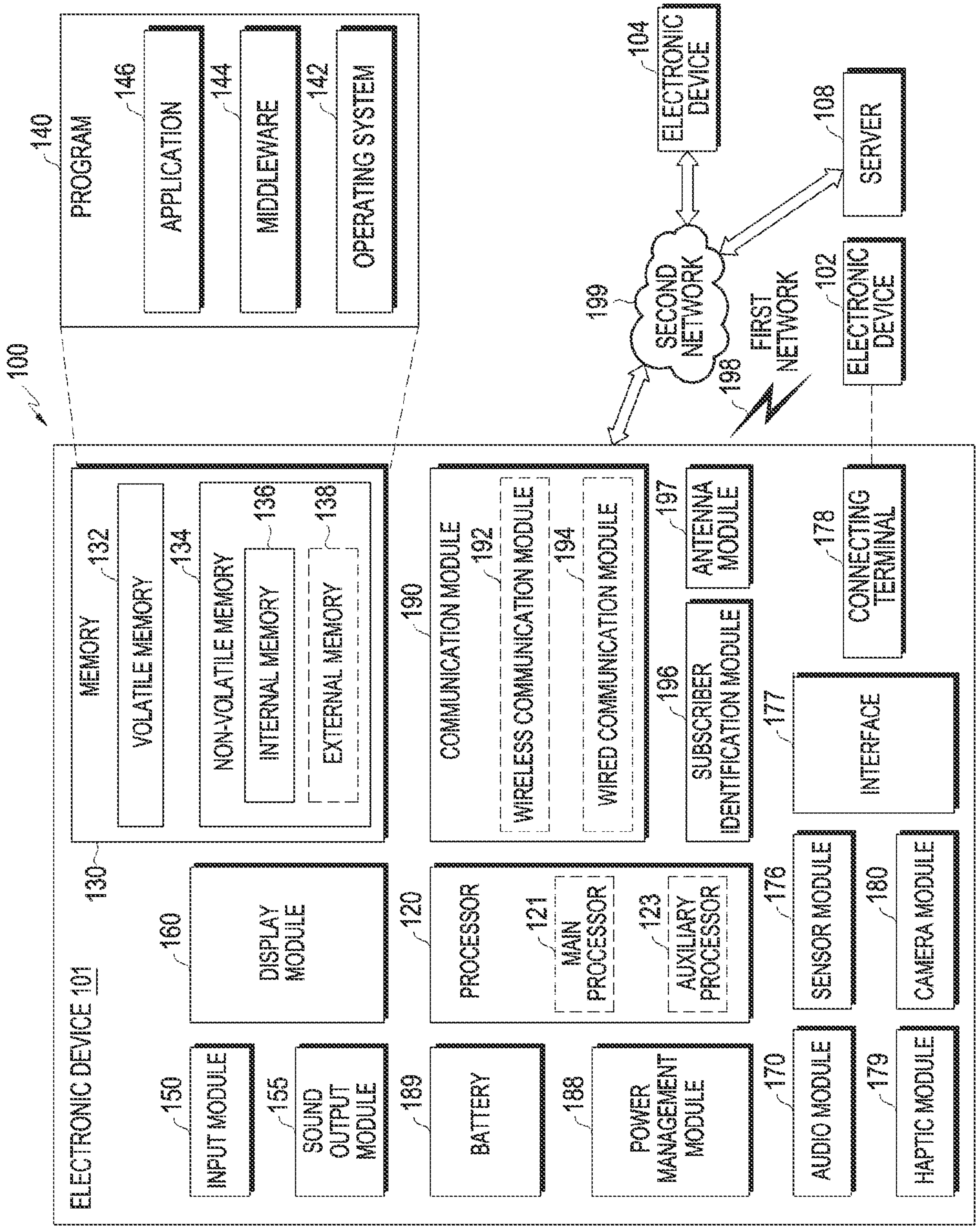
FIG. 1 is a block diagram illustrating an example electronic device in a network environment according to an embodiment disclosed herein.

FIG. 1 is a block diagram illustrating an example electronic device in a network environment according to an embodiment disclosed herein.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
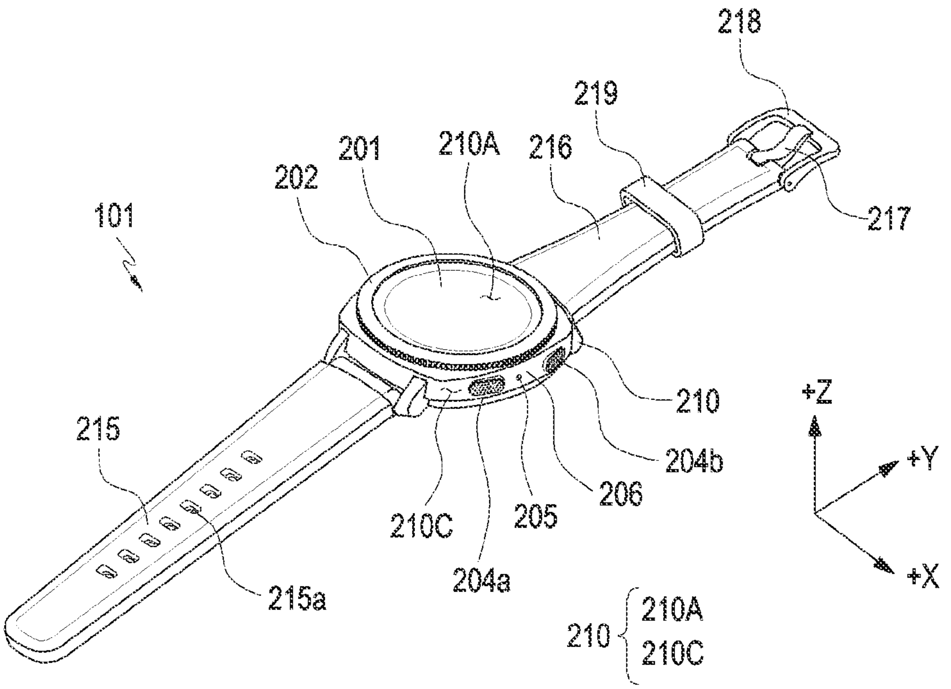
FIG. 2 is a front perspective view of a wearable electronic device according to an embodiment of the disclosure.
Figure 3:
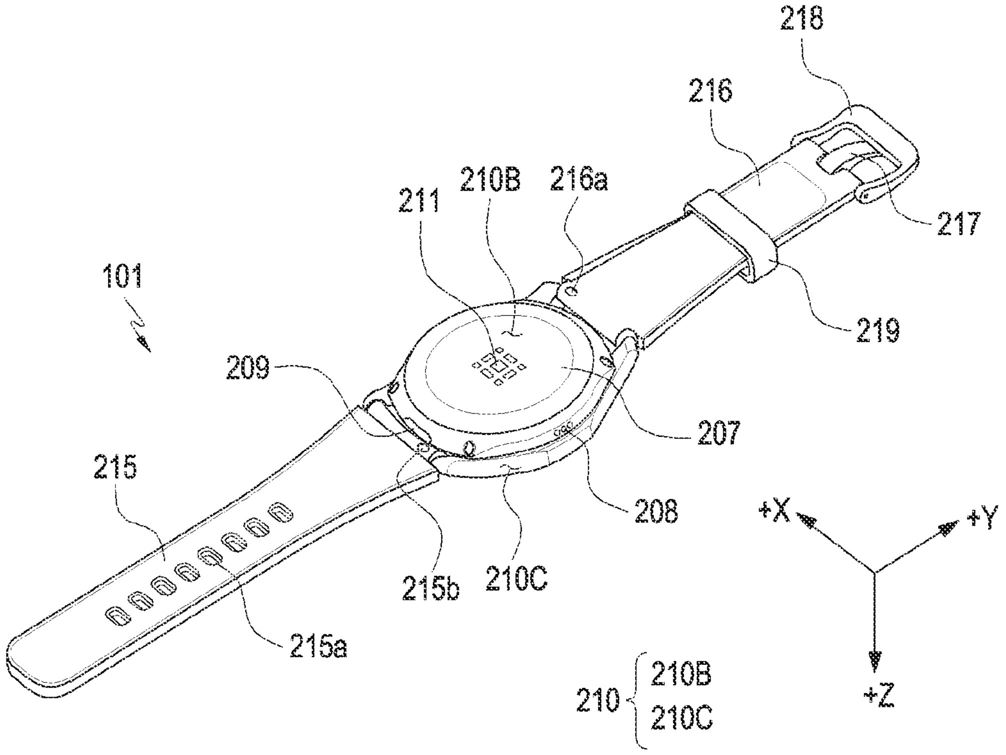
FIG. 3 is a rear perspective view of a wearable electronic device according to an embodiment of the disclosure.

FIG. 2 is a front perspective view of a wearable electronic device according to an embodiment disclosed in herein. FIG. 3 is a rear perspective view of the wearable electronic device in FIG. 2 according to an embodiment disclosed in herein.

The configuration of a wearable electronic device 101 in FIGS. 2 and 3 may be the same, in whole or in part, as the configuration of the electronic device (or wearable electronic device) 101 in FIG. 1.

In the following detailed description, in FIGS. 2 and 3, a width direction or a length direction of the wearable electronic device 101 or a housing 210 may be in any one of the "X-axis direction" and "Y-axis direction" of an illustrated orthogonal coordinate system. When a distinction between the width direction and the length direction is required, the directions of the orthogonal coordinate system illustrated in the drawings may be written. In the orthogonal coordinate system in FIGS. 2 to 4, the "Z-axis direction" may refer to a thickness direction of the wearable electronic device 101 or the housing 210. In an embodiment, a direction faced by the front surface (e.g., a first surface 210A in FIG. 2) of the wearable electronic device 101 or the housing 210 may be defined as "a first direction" or "the +Z direction", and a direction faced by the rear surface (e.g., a second surface 210B in FIG. 3) of the wearable electronic device 101 or the housing 210 may be defined as "a second direction" or "the −Z direction".

Referring to FIGS. 2 and 3, the wearable electronic device 101 according to an embodiment may include a housing 210 including a first surface (or a front surface) 210A, a second surface (or a rear surface) 210B, and a side surface 210C surrounding a space between the first surface 210A and the second surface 210B, and wearing members (e.g., bands) 215 and 216 connected to at least a portion of the housing 210 and configured to attach the wearable electronic device 101 or the housing 210 to a portion (e.g., a wrist, an ankle, etc.) of a user's body. In an embodiment (not shown), the housing 210 may refer to a structure forming at least some of the first surface 210A, the second surface 210B, and the side surface 210C in FIG. 2. According to an embodiment, the first surface 210A may be formed by a front plate 201 that is at least partially substantially transparent (e.g., a polymer plate or a glass plate including various coating layers). The second surface 210B may be formed by a substantially opaque rear plate 207. In an embodiment, when the electronic device includes a first sensor module 211 disposed on the second surface 210B, the rear plate 207 may include an area which is at least partially transparent. The rear plate 207 may be formed of, for example, coated or tinted glass, ceramic, polymer, metal (e.g., aluminum, stainless steel (STS), or magnesium), or a combination of at least two of the materials. The side surface 210C may be formed by a lateral bezel structure (or a "lateral member") 206 that is coupled to the front plate 201 and/or the rear plate 207 and contains metal and/or polymer. In an embodiment, the rear plate 207 and the lateral bezel structure 206 may be integrally formed and include the same material (e.g., a metal material such as aluminum). The wearing members 215 and 216 may be formed of various materials and in various shapes. The wearing members may be integrally formed of woven fabric, leather, rubber, urethane, metal, ceramic, or a combination of at least two of the materials, and may be formed such that multiple unit links may be moved with each other.

According to an embodiment, wearable electronic device 101 may include at least one among a display 220 (see FIG. 4) (e.g., the display module 160 in FIG. 1), audio modules 205 and 208, the first sensor module 211 (e.g., the sensor module 176 in FIG. 1), key input devices 202, 204*a*, and 204*b*, and a connector hole 209. In an embodiment, the wearable electronic device 101 may omit at least one (e.g., the key input devices 202, 204*a*, and 204*b*, the connector hole 209, or the first sensor module 211) of the elements, or may additionally include other elements.

The display (e.g., the display 220 in FIG. 4) may be visible, for example, through a substantial portion of the front plate 201. The shape of the display 220 may be a shape that corresponds to the shape of the front plate 201, and may have various shapes, such as circular, oval, or polygonal. The display 220 may be coupled to or disposed adjacent to a touch sensing circuit, a pressure sensor capable of measuring the strength (pressure) of a touch, and/or a fingerprint sensor.

The audio modules 205 and 208 may include a microphone hole 205 and a speaker hole 208. The microphone hole 205 may have a microphone disposed therein to acquire sound from the outside, and according to an embodiment, multiple microphones may be disposed to detect the direction of sound. The speaker hole 208 may be used as an external speaker and a receiver for calls.

The sensor module (e.g., the sensor module 176 in FIG. 1) may generate electrical signals or data values that correspond to an internal operational state of the wearable electronic device 101 or an external environmental state. In an embodiment, the sensor module may include the first sensor module 211, which is a biometric sensor (e.g., an HRM sensor) disposed on the second surface 210B of the housing 210. The wearable electronic device 101 may further include at least one among sensor modules not shown, such as a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The key input devices 202, 204*a*, and 204*b* may include a wheel key 202, disposed on the first surface 210A of the housing 210 and rotatable in at least one direction, and/or side key buttons 204*a* and 204*b*, disposed on the side surface 210C of the housing 210. The wheel key 202 may have a shape corresponding to the shape of the front plate 201. In an embodiment, the wearable electronic device 101 may not include some or all of the above-described key input devices 202, 204*a*, and 204*b*, and the key input devices 202, 204*a*, and 204*b* that are not included may be implemented in the form of a soft key on the display 220. The connector hole 209 may accommodate a connector (e.g., a USB connector) for transmitting and receiving power and/or data to and from an external electronic device, may include another connector hole (not shown) capable of accommodating a connector for transmitting and receiving audio signals to and from an external electronic device. The wearable electronic device 101 may further include, for example, a connector cover (not shown) that covers at least a portion of the connector hole 209 to block the introduction of external foreign matter into the connector hole.

The wearing members 215 and 216 may be detachably coupled to at least a portion of the housing 210 using locking members 215*b* and 216*a*. The locking members 215*b* and 216*a* may include a binding component, such as a pogo pin, and may be replaced by a protrusion(s) or a recess(es) formed in the wearing members 215 and 216 according to an embodiment. For example, the wearing members 215 and 216 may be coupled in a manner that engages with a groove or a protrusion formed in the housing 210. The wearing members 215 and 216 may include one or more of a fixing member 217, a fixing member fastening hole 215*a*, a band guide member 218, and a band fixing loop 219.

The fixing member 217 may be configured to fix the housing 210 and the wearing members 215 and 216 to a portion (e.g., a wrist, an ankle, etc.) of a user's body. The fixing member fastening hole 215*a* may correspond to the fixing member 217 to fix the housing 210 and the wearing members 215, 216 to a portion of the user's body. The band guide member 218 may be configured to limit the movement range of the fixing member 217 when the fixing member 217 is fastened to the fixing member fastening hole 215*a*, thereby enabling the wearing members 215 and 216 to be in close contact with and attached to the user's body part. The band fixing loop 219 may limit the movement range of the wearing members 215 and 216 while the fixing member 217 is fastened to the fixing member fastening hole 215*a*.

Figure 4:
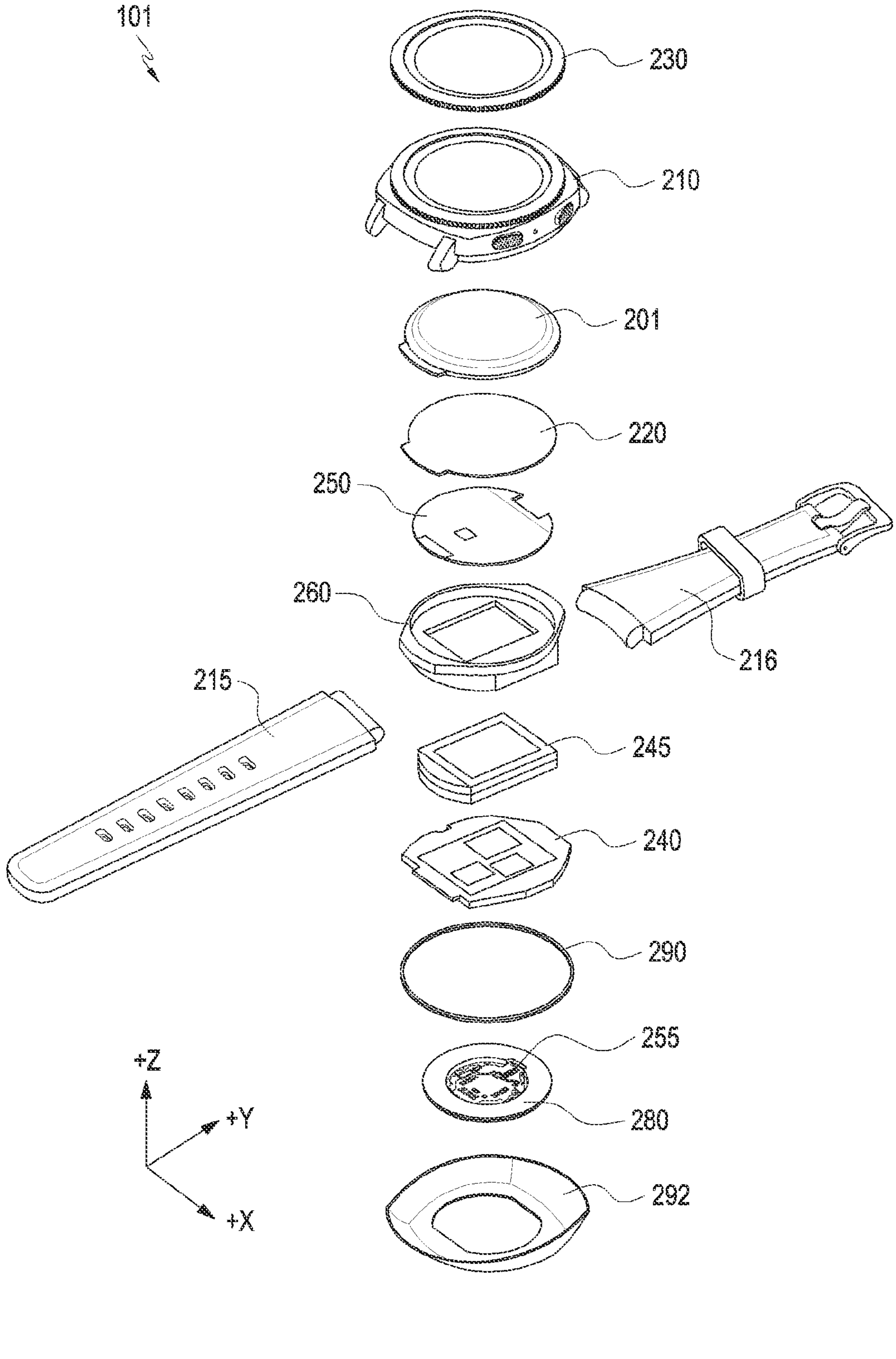
FIG. 4 is an exploded perspective view of a wearable electronic device according to an embodiment of the disclosure.

FIG. 4 is an exploded perspective view of a wearable electronic device according to an embodiment of the disclosure.

Referring to FIG. 4, a wearable electronic device 101 may include a housing 210 (or a lateral bezel structure) (e.g., the housing 210 in FIGS. 2 and 3), a wheel key 230, a front plate 201 (e.g., the front plate 201 in FIG. 2), a display 220 (e.g., the display module 160 in FIG. 1), a first antenna 250 (e.g., the antenna module 197 in FIG. 1), a second antenna (e.g., an antenna (e.g., the antenna module 197 in FIG. 1) in an auxiliary circuit board 255), a support member 260 (e.g., a bracket), a battery 245 (e.g., the battery 189 in FIG. 1), a printed circuit board 240, a sealing member 290, a rear plate 292, and wearing members 215 and 216 (e.g., the wearing members 215 and 216 in FIGS. 2 and 3). At least one of the elements of the wearable electronic device 101 may be the same as or similar to at least one of the elements of the wearable electronic device 101 in FIG. 2 or 3, and redundant descriptions will be omitted below.

In an embodiment, the support member 260 may be disposed in the wearable electronic device 101, and may be connected to or integrated with the housing 210. The support member 260 may be formed of, for example, a metal material and/or a non-metal (e.g., polymer) material. The support member 260 may have one surface coupled to the display 220 and the other surface coupled to the printed circuit board 240. A processor (e.g., the processor 120 in FIG. 1), memory (e.g., the memory 130 in FIG. 1), and/or an interface (e.g., the interface 177 in FIG. 1) may be disposed on the printed circuit board 240. The processor may include one or more of, for example, a central processing unit, an application processor, a graphic processing unit (GPU), a sensor processor, or a communication processor.

The memory may include, for example, volatile memory or non-volatile memory. The interface may include, for example, a high-definition multimedia interface (HDMI), a universal serial bus (USB) interface, an SD card interface, and/or an audio interface. The interface may, for example, electrically or physically connect the wearable electronic device 101 to an external wearable electronic device, and may include a USB connector, an SD card/MMC connector, or an audio connector.

The battery 245 is a device for supplying power to at least one element of the wearable electronic device 101, and may include, for example, a non-rechargeable primary battery, a rechargeable secondary battery, or a fuel cell. At least a portion of the battery 245 may be substantially coplanar with the printed circuit board 240, for example. The battery 245 may be integrally disposed inside the wearable electronic device 101, or may be disposed detachably from the wearable electronic device 101.

The first antenna 250 may be disposed between the display 220 and the support member 260. The first antenna 250 may include, for example, a near-field communication (NFC) antenna, a wireless charging antenna, and/or a magnetic secure transmission (MST) antenna. The first antenna 250 may, for example, perform near-field communication with an external device, wirelessly transmit and receive power for charging, and transmit a near-field communication signal or a magnetic-based signal including payment data. In an embodiment, antenna structures may be formed by portions of the housing 210 and/or the support member 260 or a combination thereof.

The auxiliary circuit board 255 may be disposed between the printed circuit board 240 and the rear plate 292. The auxiliary circuit board 255 may include an antenna, for example, a near-field communication (NFC) antenna, a wireless charging antenna, and/or a magnetic secure transmission (MST) antenna. The auxiliary circuit board 255 may, for example, perform near-field communication with an external device, wirelessly transmit and receive power for charging, and transmit a near-field communication signal or a magnetic-based signal including payment data. In an embodiment, an antenna structure may be formed by portions of the housing 210 and/or the rear plate 292, or a combination thereof.

In an embodiment, when the wearable electronic device 101 (e.g., the wearable electronic device 101 in FIGS. 2 and 3) includes a sensor module (e.g., the sensor module 176 in FIG. 1 or the first sensor module 211 in FIG. 3), a separate sensor circuit or a sensor element may be disposed in a sensor circuit disposed on the auxiliary circuit board 255. The sensor circuit or the sensor element may include, for example, a light-emitting element, a photoelectric conversion element, or an electrode pad.

According to an embodiment, a coil assembly 280 (e.g., a wireless charging coil) may be disposed between the printed circuit board 240 and the rear plate 292. The coil assembly 280 may be electrically connected to the printed circuit board 240 and/or the auxiliary circuit board 255. For example, the coil assembly 280 may be disposed around the auxiliary circuit board 255. The coil assembly 280 may be a charging coil in which a current is induced in response to a magnetic field from an externally disposed wireless charging device. In an embodiment, the auxiliary circuit board 255 and the coil assembly 280 may together comprise a wireless charging assembly. For example, the auxiliary circuit board 255 and the coil assembly 280 may be integrally formed.

The sealing member 290 may include a seal and be located between the housing 210 and the rear plate 292. The sealing member 290 may be configured to block moisture and foreign matter from entering the space surrounded by the housing 210 and the rear plate 292 from the outside.

The wearing members 215 and 216 may include bands connected to different areas of the housing 210, and may be disposed in a symmetrical shape.

In describing the various example embodiments below, reference may be made to the above-described electronic device 101 in FIGS. 1 to 4, and elements, which can be easily understood from the above-described embodiments, may be given the same drawing reference numerals or omitted, and detailed descriptions thereof may also be omitted.

Figure 5:
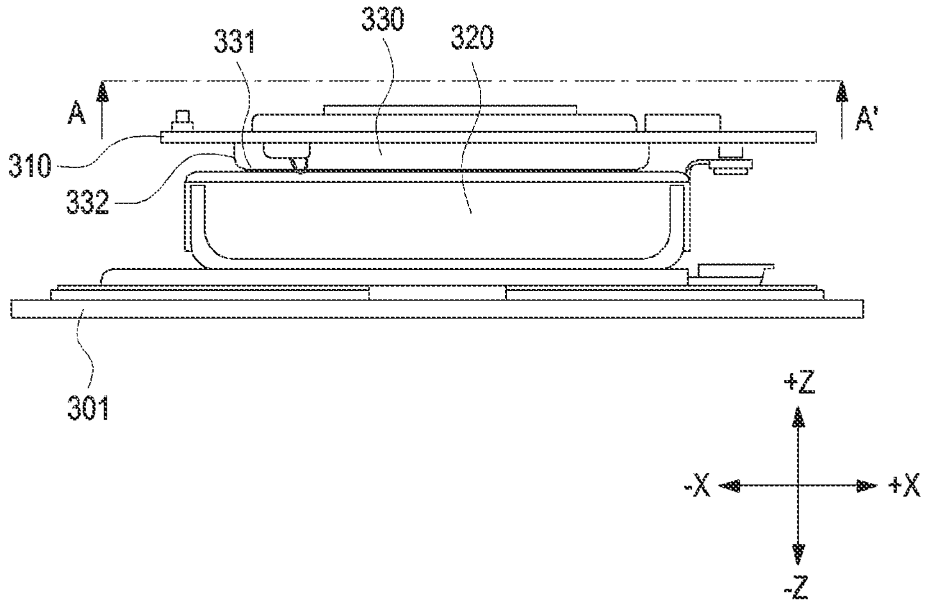
FIG. 5 is a diagram illustrating a side view of the arrangement relationship of a printed circuit board, a shield can, and a battery according to an embodiment of the disclosure.

FIG. 5 is a diagram illustrating a side view of the arrangement relationship of a printed circuit board 310, a shield can 330, and a battery 320 according to an embodiment of the disclosure.

Referring to FIG. 5, a wearable electronic device 101 (e.g., the wearable electronic device 101 in FIGS. 2 and 3) may include a housing 301, the printed circuit board 310, the battery 320, and the shield can 330. The configuration of the housing 301, the printed circuit board 310, and the battery 320 in FIG. 5 may be the same, in whole or in part, as the configuration of the housing 210, the printed circuit board 240, and the battery 245 in FIGS. 2 to 4. The structure in FIG. 5 may be selectively combined with the structures in FIGS. 2 to 4.

According to an embodiment, the rear surface (e.g., the second surface 210B in FIG. 3) of the housing 301 may be formed by a substantially opaque rear plate (e.g., the rear plate 207 in FIG. 3). The rear plate may be disposed adjacent to the battery 320. The rear plate may be formed of, for example, coated or tinted glass, ceramic, polymer, metal (e.g., aluminum, stainless steel (STS), or magnesium), or a combination of at least two of the materials.

According to an embodiment, at least a portion of the housing 301 may be utilized as a radiator for implementing a call-support network (e.g., 3G, LTE, and/or 5G) and connectivity (e.g., GPS, BT, WLAN, or NFC) antenna. According to an embodiment, at least a portion of the housing 301 may be selectively utilized as a radiator.

According to an embodiment, the printed circuit board 310 disposed in the housing 301 may be a circuit board with a double-sided printed wiring structure. A double-sided printed circuit board is one in which a circuit pattern is formed on both upper and lower surfaces and/or electrical (e.g., electronic) components are disposed on both upper and lower surfaces, and the upper and lower circuits are connected to each other through holes (e.g., via hole) located in the printed circuit board. According to an embodiment, the printed circuit board 310 disposed in the housing 301 may be a circuit board with a multilayer printed wiring structure. The multilayer printed circuit board is a circuit board with a three-dimensional structure having an inner layer circuit and an outer layer circuit, and enables high-density component mounting and wiring distance reduction by three-dimensional wiring. However, the configuration and type of the printed circuit board 310 are not limited to the above embodiment, and the printed circuit board 310 may be variously designed to be single-sided, double-sided, and multilayer boards depending on the location and number of circuit patterns formed.

According to an embodiment, the battery 320 may be disposed adjacent to the printed circuit board 310. For example, the battery 320 may be disposed below the printed circuit board 310 (e.g., in the −Z direction in FIG. 5). For example, referring to FIG. 4, the battery 320 may be disposed on the printed circuit board 310 (e.g., in the +Z direction in FIG. 4). According to an embodiment, the battery 320 may be disposed on the rear plate (e.g., the rear plate 207 in FIG. 3) (e.g., in the +Z direction in FIG. 5).

According to an embodiment, the shield can 330 may include a component that is attached to the printed circuit board 310 so as to block electromagnetic waves generated by the printed circuit board 310 of the wearable electronic device or electronic components (e.g., including various circuitry) located on the printed circuit board 310 (noise prevention) and prevent and/or reduce malfunction of an electronic device and a communication device. The shield can 330 is disposed between the printed circuit board 310 and the battery 320, and may be disposed on the printed circuit board 310 to cover a portion of the printed circuit board 310. The shield can 330 may be made of a conductive metal and may have an area corresponding to a shielded area to cover at least a portion of the shielded area. The shield can 330 may include a conductive metal, such as stainless steel. The shield can 330 may be disposed to surround electronic components mounted on the printed circuit board 310. Accordingly, it is possible to prevent and/or reduce electromagnetic waves from causing internal interference between electronic components and radiating to the outside. The shield can 330 may be of various types, such as a screw type, a clip type, a cover type, or a frame type. According to an embodiment, the shield can 330 according to the disclosure may be a cover-type shield can 330 that includes only a cover for covering the electronic components, wherein the cover itself is bonded to the printed circuit board 310. According to an embodiment, due to being formed in the shape of a plate having a predetermined thickness, the shield can 330 may have rigidity, and may thus provide structural stability. The shield can 330 may include a shield plate 331 (or a shielding tape), and a sidewall 332 that are bent downwardly along an edge of the shield plate 331. The shield plate 331 may be substantially flat and may cover the top of the shielded area. At least one air discharge hole (not shown) may be formed in the shield plate 331 to allow thermally expanded air can to be discharged from an insulating space formed between the shield plate 331 and the printed circuit board 310. However, the structure and type of the shield can 330 is not limited to the embodiment, and may be subject to various design changes. According to an embodiment, the shield can 330 may include a metal alloy containing a copper component (Cu-18Zn-12N alloy) or a metal with Ni plating on a copper alloy.

According to an embodiment, at least a portion of the shield can 330 may be utilized as a radiator for implementing a call-support network (e.g., 3G, LTE, and/or 5G) and connectivity (e.g., GPS, BT, WLAN, or NFC) antenna. According to an embodiment, at least a portion of the shield can 330 may be selectively utilized as a radiator.

According to an embodiment, an electronic device comprises an antenna module that includes at least part of the housing and at least part of the shield can. An antenna module transmits or receives signals or power between external electronic devices using at least part of the housing and at least part of the shield can.

Figure 6:
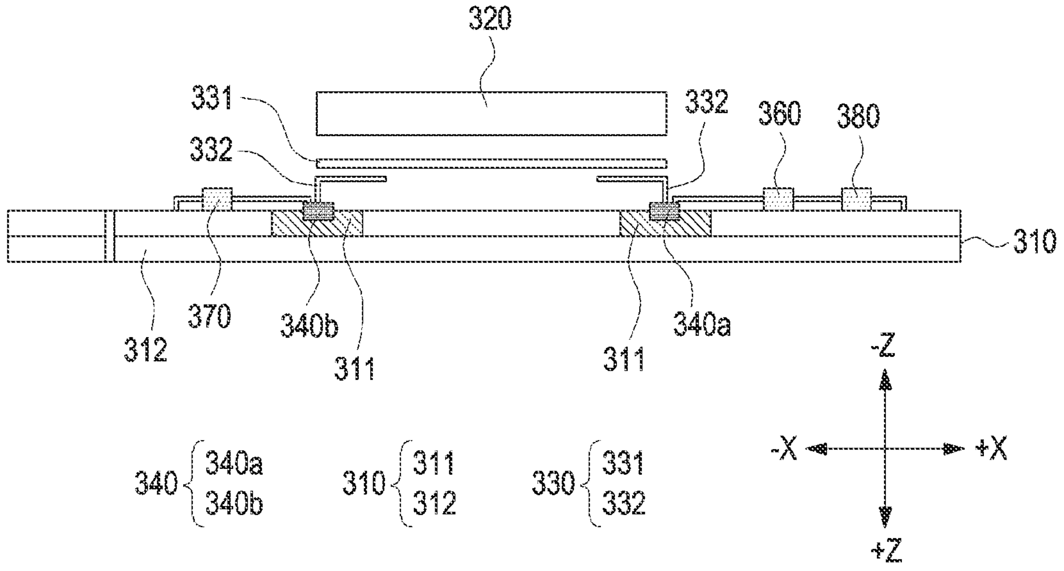
FIG. 6 is a cross-sectional view of the printed circuit board, the shield can, and the battery in FIG. 5, taken along line A-A', according to an embodiment of the disclosure.

FIG. 6 is a cross-sectional view of the printed circuit board 310, the shield can 330, and the battery 320 in FIG. 5, taken along line A-A', according to an embodiment of the disclosure.

Referring to FIG. 6, the wearable electronic device 101 (e.g., the wearable electronic device 101 in FIGS. 2 and 3) may include a housing (e.g., the housing 301 in FIG. 5), the printed circuit board 310, the battery 320, and the shield can 330. The configuration of the housing 301, the printed circuit board 310, the battery 320, and the shield can 330 in FIG. 6 may be the same, in whole or in part, as the configuration of the housing 301, the printed circuit board 310, the battery 320, and the shield can 330 in FIG. 5. The structure in FIG. 6 may be selectively combined with the structure in FIG. 5.

According to an embodiment, the printed circuit board 310 may include a wireless communication module (e.g., wireless communication module 192 in FIG. 1) electrically connected to an antenna radiator, a radio frequency (RF) switch 360, a first electrical (e.g., electronic) component 370, and a second electrical (e.g., electronic) component 380.

According to an embodiment, the wireless communication module may include various communication circuitry and be disposed on the printed circuit board 310 surrounded by the shield can 330. The wireless communication module (not shown) may be electrically connected to multiple antenna radiators (e.g., the housing (e.g., the housing 301 in FIG. 5). the shield can 330, the second electrical component 380, a third electrical component (e.g., the third electrical component 381 in FIG. 10), and a fourth electrical component (e.g., the fourth electrical component 382 in FIG. 10)).

According to an embodiment, the radio frequency (RF) switch 360 may include a switch circuit capable of determining whether to let an RF signal through or block the RF signal, and may be used to electrically connect an antenna to a particular transmission or reception path of an RF system. For example, the radio frequency (RF) switch 360 may be used to implement adjustable matching networks for antennas and power amplifiers, and to adjust tuning for high frequency filters by switching in and out and/or bypassing passive matching and tuning elements. According to an embodiment, the radio frequency (RF) switch 360 may be unconstrained in the mounting location thereof. The radio frequency switch 360 may be disposed adjacent to multiple pads 340. The radio frequency (RF) switch 360 is electrically connected to one of the multiple pads 340, and thus may be placed in any space where the radio frequency (RF) switch 360 can be electrically connected to the multiple pads 340.

According to an embodiment, the radio frequency (RF) switch 360 may include a sufficient number of terminals (e.g., switch 360 ports) to allow multiple transmitters and receivers to be connected to antennas. For example, the radio frequency (RF) switch 360 may be a single pole four throw (SP4T) or single pole five throw (SP5T) switch. For example, the radio frequency (RF) switch 360 may be a single pole four throw (SP4T) switch that selects at least one of four paths and allows passages of RF signals wia the selected path(s). However, the number of terminals of the radio frequency (RF) switch 360 is not limited to the above-described embodiment, and various design changes may be made.

According to an embodiment, the first electrical component 370 may be an electrical or electronic component that stops a current above a specific frequency. For example, in terms of the electrical connections of an antenna, the first electrical component 370 may be made to look like an open circuit. For example, the first electrical component 370 may be a radio frequency choke (RF choke; RFC) that has an impedance value increasing with respect to a high frequency signal. For example, the first electrical component 370 may be an alternating current power disconnect component (an AC block) that allows DC components to pass through while blocking AC components. The first electrical component 370 may be, for example, a bead element.

According to an embodiment, the first electrical component 370 may electrically connect the shield can 330 to the printed circuit board 310. The multiple pads 340 of the shield can 330 may be disposed on the printed circuit board 310 in an electrically insulated state, and electrically connected to another circuit through the radio frequency (RF) switch 360, the first electrical component 370 and/or the second electrical component 380.

According to an embodiment, the second electrical (e.g., electronic) component 380 may be electrically connected to the radio frequency switch 360. The second electrical component 380 may be a component for tuning the time constant of the antenna to adjust an antenna length value and improve performance. The second electrical component 380 may be, for example, an element, an inductor, or a capacitor on the printed circuit board 310. The second electrical component 380 may be a portion of the housing 301.

Figure 10:
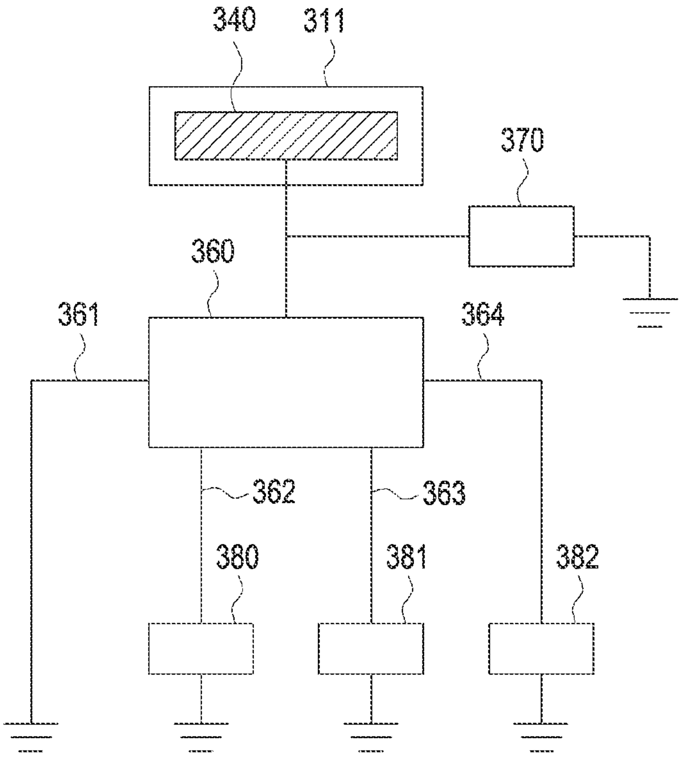
FIG. 10 is a circuit diagram including an RF switch according to an embodiment of the disclosure.

According to an embodiment, the printed circuit board 310 may further include the third electrical component (e.g., the third electrical component 381 in FIG. 10). The third electrical component (e.g., the third electrical component 381 in FIG. 10) may be electrically connected to the radio frequency switch 360. The third electrical component (e.g., the third electrical component 381 in FIG. 10) may be a component for tuning the time constant of the antenna to adjust an antenna length value and improve performance. The third electrical component (e.g., the third electrical component 381 in FIG. 10) may be, for example, an element, an inductor, or a capacitor on the printed circuit board 310, and the third electrical component (e.g., the third electrical component 381 in FIG. 10) may be a portion of the housing 301.

According to an embodiment, the printed circuit board 310 may further include the fourth electrical component (e.g., the fourth electrical component 382 in FIG. 10). The fourth electrical component (e.g., the fourth electrical component 382 in FIG. 10) may be electrically connected to the radio frequency switch 360. The fourth electrical component (e.g., the fourth electrical component 382 in FIG. 10) may be a component for tuning the time constant of an antenna to adjust an antenna length value and improve performance. The fourth electrical component (e.g., the fourth electrical component 382 in FIG. 10) may be, for example, an element, an inductor, or a capacitor on the printed circuit board 310, and the fourth electrical component (e.g., the fourth electrical component 382 in FIG. 10) may be a portion of the housing 301.

According to an embodiment, the shield can 330 may further include multiple pads 340 which are in contact with the printed circuit board 310 and fix the position of the shield can 330 on the printed circuit board 310. For example, the multiple pads 340 may be attached to at least a portion of the bottom of the sidewall 332 of the shield can 330. The multiple pads 340 may be mounted on the printed circuit board 310 by a surface mount technology (SMT) process of mounting and soldering the shield can 330 to the printed circuit board 310, or may be detachably coupled to the printed circuit board 310.

According to an embodiment, the multiple pads 340 may include a first pad 340*a* electrically connected to the radio frequency switch 360, and a second pad 340*b* electrically connected to the first electrical component 370.

For example, the multiple pads 340 are disposed in an electrically isolated state on the printed circuit board 310, but are electrically connected to the radio frequency switch 360 and/or the first electrical component 370. According to an embodiment, the printed circuit board 310 may include portions in contact with the multiple pads 340, and may include multiple first areas 311 electrically isolated from the multiple pads 340, and a second area 312 excluding the multiple first areas 311, so that an electrically separated(or insulated) environment can be provided to the multiple pads 340. This will be described in greater detail below.

Figure 7:
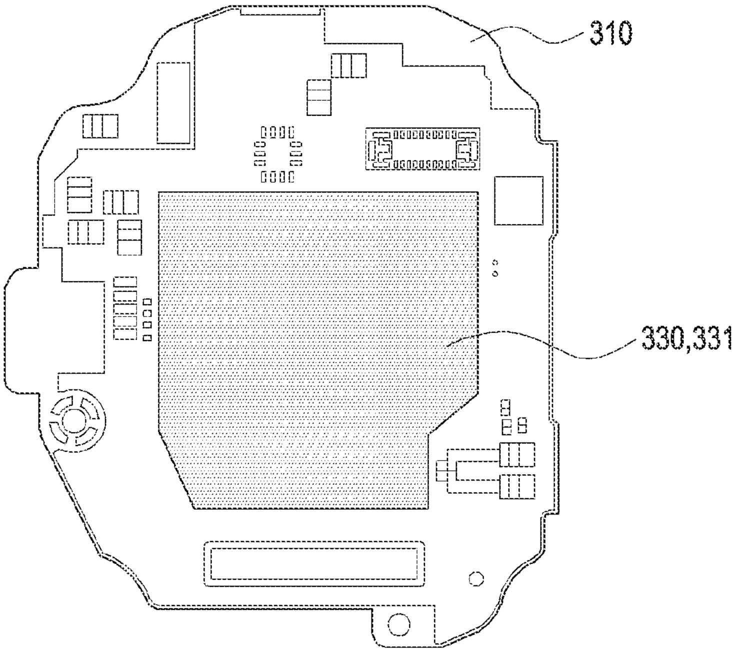
FIG. 7 is a diagram illustrating a printed circuit board and a shield can according to an embodiment of the disclosure.
Figure 8:
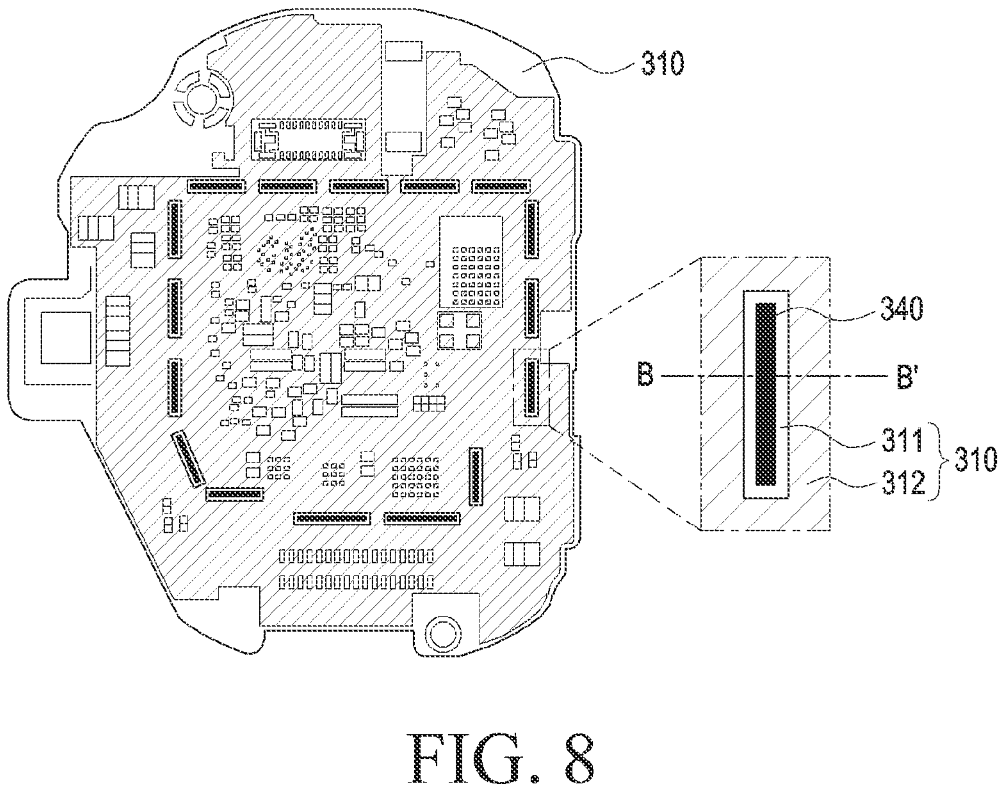
FIG. 8 is a diagram illustrating a printed circuit board and multiple pads according to an embodiment of the disclosure.
Figure 9:
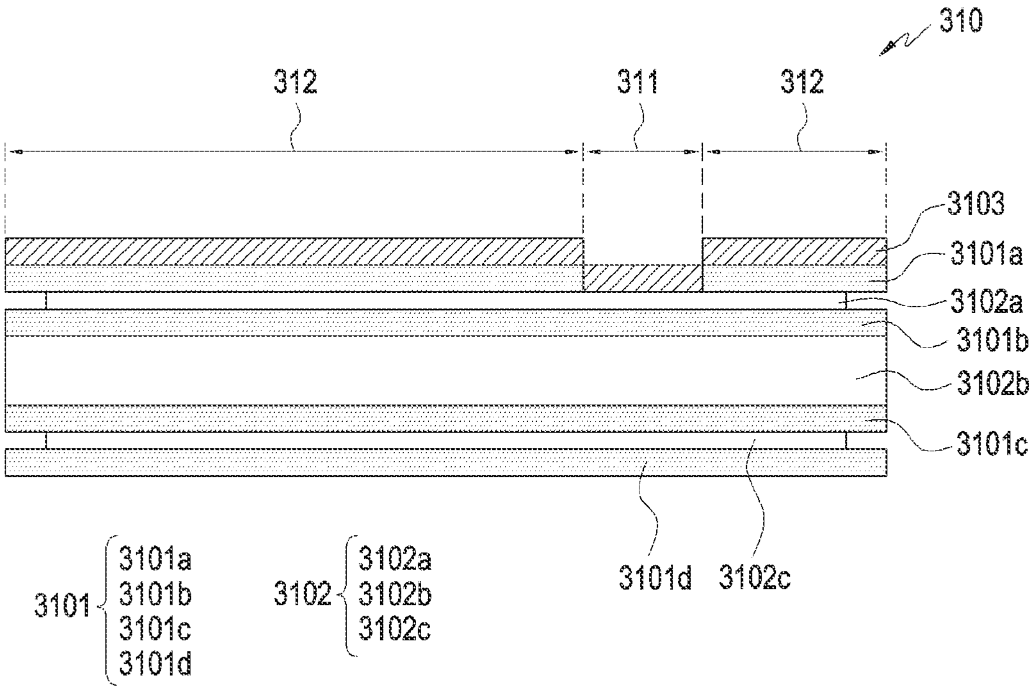
FIG. 9 is a cross-sectional view of a printed circuit board 310 in FIG. 8, taken along line B-B', according to an embodiment of the disclosure.

FIG. 7 is a diagram illustrating a printed circuit board 310 and a shield can 330 according to an embodiment of the disclosure. FIG. 8 is a diagram illustrating a printed circuit board 310 and multiple pads 340 according to an embodiment of the disclosure. FIG. 9 is a cross-sectional view of the printed circuit board 310 in FIG. 8, taken along line B-B', according to an embodiment of the disclosure.

Referring to FIGS. 7,8 and 9 (which may be referred to as FIGS. 7 to 9), a wearable electronic device 101 (e.g., the wearable electronic device 101 in FIGS. 2 and 3) may include a printed circuit board 310 and a shield can 330. The configuration of the printed circuit board 310 and the shield can 330 in FIGS. 7 to 9 may be the same, in whole or in part, as the configuration of the printed circuit board 310 and the shield can 330 in FIG. 6. The structures in FIGS. 7 to 9 may be selectively combined with the structure in FIG. 6.

According to an embodiment, the shield can 330 may be disposed on a partial area (e.g., a center area) of the printed circuit board 310 to cover the partial area of the printed circuit board 310. According to an embodiment, the multiple pads 340 of the shield can 330 may be spaced apart from each other along an edge of the shield can 330. For example, the multiple pads 340 may be spaced apart from each other at regular intervals along the sidewalls 332 of the shield can 330. The multiple pads 340 may be rectangular in shape. However, the shape of the multiple pads 340 is not limited to the above embodiment. The multiple pads 340 may be grounding pads that may be electrically connected to the printed circuit board 310. However, in order to electrically isolate the multiple pads 340 of the disclosure from the printed circuit board 310, multiple first areas 311 of the printed circuit board 310 which are in contact with the multiple pads 340 may be isolated from the printed circuit board 310.

According to an embodiment, the multiple first areas 311 of the printed circuit board 310 may include the multiple pads 340 and may be areas that are electrically isolated from a ground layer of the printed circuit board 310. For example, each first area 311 including the multiple first areas 311 may include a corresponding pad 340 including the multiple pads 340. The second area 312 of the printed circuit board 310 may be an area, other than the multiple first areas 311, which is electrically connected to the ground layer. According to an embodiment, the multiple first areas 311 of the printed circuit board 310 may be formed to correspond to the size and shape of the multiple pads 340. For example, the multiple first areas 311 may include respective pads including the multiple pads 340 and may be formed larger than the respective pads. For example, the shape of the multiple first areas 311 may be a rectangular shape that is larger in size than the multiple pads 340. However, the shape of the multiple first areas 311 is not limited to the above embodiment.

According to an embodiment, referring to FIG. 9, the printed circuit board 310 may include at least one conductive layer 3101 and at least one insulating layer (dielectric layer) 3102, and may have photo-imageable solder resist mask ink (PSR ink) 3103 applied to the top thereof to prevent and/or reduce a solder bridging phenomenon. A multilayer printed circuit board 310 may have conductive layers 3101 and insulating layers (dielectric layers) 3102 which are alternately arranged. The conductive layers 3101 may include conductors, for example, copper foil. Each of the insulating layers 3102 (prepreg, core) is a dielectric and may act as an adhesive between the conductive layers 3101.

According to an embodiment, unlike the second area 312, the multiple first areas 311 of the printed circuit board 310 may be in a state in which a conductive layer (e.g., 3101*a* in FIG. 9) placed on the top thereof has been removed. For example, the second area 312 of the printed circuit board 310 may be stacked in the order of the PSR layer 3103, a first conductive layer 3101*a*, a first insulating layer 3102*a*, and a second conductive layer 3101*b*, and the multiple first areas 311 of the printed circuit board 310 may be stacked in the order the PSR layer 3103, the first insulating layer 3102*a*, and the second conductive layer 3101*b*. For example, referring to FIG. 9, the second area 312 of the printed circuit board 310 is stacked in the order of the PSR layer 3103, the first conductive layer 3101*a*, the first insulating layer 3102*a* (prepreg), the second conductive layer 3101*b*, a second insulating layer 3102*b* (core), a third conductive layer 3101*c*, a third insulating layer 3102*c* (prepreg), and a fourth conductive layer 3101*d*. Furthermore, the multiple first areas 311 of the printed circuit board 310 may be stacked in the order of the PSR layer 3103, the first insulating layer 3102*a* (prepreg), the second conductive layer 3101*b*, the second insulating layer 3102*b* (core), the third conductive layer 3101*c*, the third insulating layer 3102*c* (prepreg), and the fourth conductive layer 3101*d*.

According to an embodiment, the multiple pads 340 may be disposed on the multiple first areas 311, and may be electrically isolated from the first conductive layer 3101.

Figure 11:
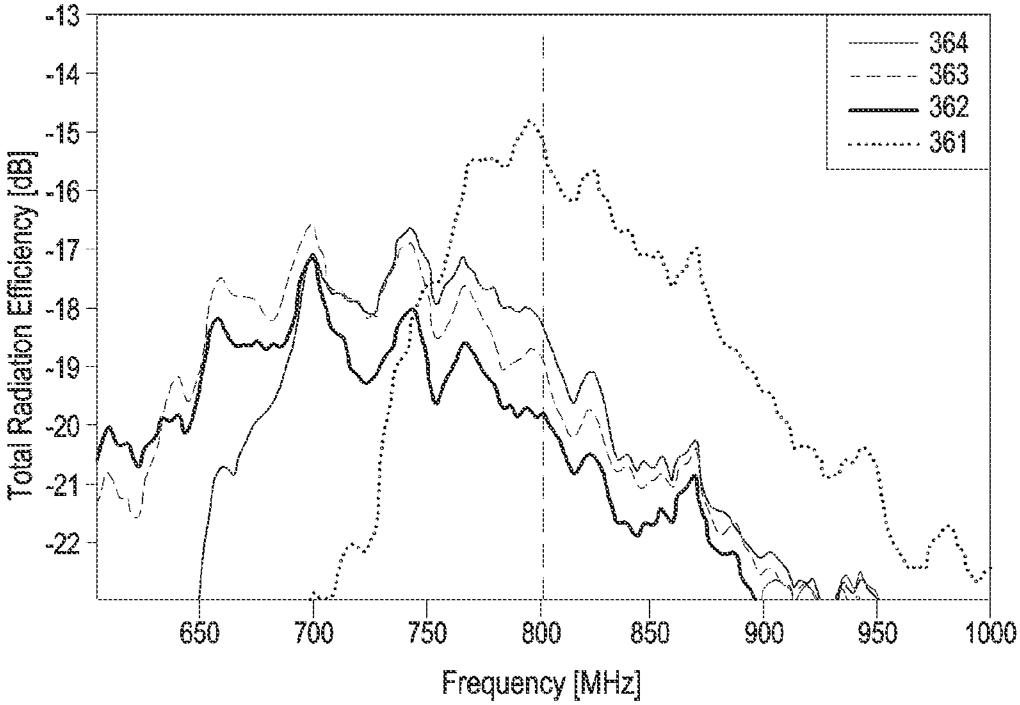
FIG. 11 is a graph illustrating radiation efficiency based on frequencies appearing along multiple paths by a radio frequency switch.

FIG. 10 is a diagram illustrating a circuit view including an RF switch 360 according to an embodiment of the disclosure. FIG. 11 is a graph illustrating radiation efficiency based on frequencies appearing along multiple paths by the radio frequency switch 360 according to an embodiment of the disclosure Referring to FIGS. 10 and 11, a wearable electronic device 101 (e.g., the wearable electronic device 101 in FIGS. 2 and 3) may include a printed circuit board (e.g., the printed circuit board 310 in FIG. 9) and a shield can (e.g., the shield can 330 in FIG. 6). The configuration of the printed circuit board 310 and the shield can 330 in FIGS. 10 and 11 may be the same, in whole or in part, as the configuration of the printed circuit board 310 and the shield can 330 in FIGS. 7 to 9. The structure in FIGS. 10 and 11 may be selectively combined with the structure in FIGS. 7 to 9.

According to an embodiment, the radio frequency switch 360 may be electrically and/or operatively connected to a first electrical component 370 and the printed circuit board 310 and/or the shield can 330. According to an embodiment, the shield can 330 may be electrically connected to the printed circuit board 310 through a radio frequency (RF) switch 360 and/or a first electrical component 370. For example, the shield can 330 may provide an electromagnetic shielding structure on the printed circuit board 310 by being electrically connected to the ground conductor of the printed circuit board 310 through the radio frequency switch 360 and/or the first electrical component 370. According to an embodiment, when the wearable electronic device includes an antenna disposed in a location or an area adjacent to the shield can 330, the radio frequency switch 360 may select at least one of a plurality of paths (e.g., a first path 361, a second path 362, a third path 363, and a fourth path 364) to electrically connect the shield can 330 to the printed circuit board 310 (e.g., a ground conductor). A plurality of paths that the radio frequency switch 360 may select may have different electrical characteristics (e.g., impedance). For example, when the antenna disposed at a position adjacent to the shield can 330 is operated, the radio frequency switch 360 connects the shield can 330 to the ground through an appropriate path, thereby suppressing the generation of parasitic current in the shield can 330 and increasing the radiation efficiency of the antenna. This will be described in more detail below. According to an embodiment, the radio frequency switch 360 may include multiple terminals. For example, the radio frequency (RF) switch 360 may be a single pole four throw (SP4T) switch having four terminals. For example, the radio frequency switch 360 may include a first terminal (not shown) which is not connected to an electrical component, and a second terminal (not shown) connected to a second electrical component 380. For example, the radio frequency switch 360 may further include a third terminal (not shown) connected to a third electrical component (e.g., the third electrical component 381 in FIG. 10), and a fourth terminal (not shown) connected to a fourth electrical component (e.g., the fourth electrical component 382 in FIG. 10).

According to an embodiment, the radio frequency switch 360 may be configured to select one from among a first path 361 in which a signal in a first frequency band provided from the wireless communication module (not shown) provides first radiation efficiency, a second path 362 in which a signal in the first frequency band is connected with the second electrical component 380 to provide second radiation efficiency different from the first radiation efficiency, a third path 363 in which a signal in the first frequency band is connected with the third electrical component (e.g., the third electrical component 381 in FIG. 10) to provide third radiation efficiency, and a fourth path 364 in which a signal in the first frequency band is connected to the fourth electrical component (e.g., the fourth electrical component 382 in FIG. 10) to provide fourth radiation efficiency.

According to an embodiment, the radio frequency switch 360 may be configured to select one from among a first path 361 that is configured to cause the antenna module to have a first radiation efficiency when a signal of a first frequency band provided from the wireless communication module is applied to the first path, a second path 362 that is configured to cause the antenna module to have a second radiation efficiency different from the first radiation efficiency when a signal of the first frequency band is applied to the second path, a third path 363 that is configured to cause the antenna module to have a third radiation efficiency different from the first radiation efficiency when a signal of the first frequency band is applied to the third path, and a fourth path 364 that is configured to cause the antenna module to have a fourth radiation efficiency different from the first radiation efficiency when a signal of the first frequency band is applied to the fourth path.

According to an embodiment, when the radio frequency switch 360 selects the first path, a ground value corresponding to the shield can 330, as an open circuit, has been removed. In this case, a first antenna time constant value may be formed. When the radio frequency switch 360 selects the second path, the antenna time constant may be tuned by adjusting an antenna length value, to form a second antenna time constant value. When the radio frequency switch 360 is connected to the third electrical component (e.g., the third electrical component 381 in FIG. 10), the antenna time constant may be tuned by adjusting an antenna length value, to form a third antenna time constant value. When the radio frequency switch 360 is connected to the fourth electrical component (e.g., the fourth electrical component 382 in FIG. 10), the antenna time constant may be tuned by adjusting an antenna length value, to form a fourth antenna time constant value.

According to an embodiment, the radio frequency switch 360 may be configured to select a path which provides a relatively high radiation efficiency among the first radiation efficiency, the second radiation efficiency, the third radiation efficiency, and the fourth radiation efficiency. Accordingly, the antenna length value may be adjusted to improve antenna performance. According to an embodiment, the radio frequency switch 360 may adjust the antenna length value to increase the radiation efficiency of the antenna, thereby preventing/reducing performance degradation due to parasitic components between the shield can 330 and the battery 320, and implementing a broadband antenna through antenna resonance shifting.

According to an embodiment, referring to FIG. 11, for example, in the case of a frequency band of 800 MHz, which supports LTE, the first radiation efficiency by the first path 361 may be approximately −15 dB, the fourth radiation efficiency by the fourth path 364 may be approximately −18 dB, the third radiation efficiency by the third path 363 may be approximately −19 dB, and the second radiation efficiency by the second path 362 may be −20 dB. The radio frequency switch 360 may be configured to select the first path 361 having the highest radiation efficiency from among the multiple paths in the case of the frequency band of 800 MHZ.

According to an example embodiment of the disclosure, an electronic device may include: a housing, a printed circuit board disposed in the housing, the printed circuit board including a wireless communication module comprising communication circuitry, a radio frequency (RF) switch, a first electronic component including circuitry, and a second electronic component including circuitry electrically connected to the radio frequency switch, and a shield can disposed on the printed circuit board to cover at least a partial area of the printed circuit board and including multiple pads in contact with the printed circuit board, wherein the multiple pads include a first pad electrically connected to the radio frequency switch and a second pad electrically connected to the first electronic component, wherein the multiple pads are configured to be electrically isolated from the printed circuit board, and the radio frequency switch is configured to select one of a first path configured to cause the electronic device to have a first radiation efficiency based on a signal of a first frequency band provided from the wireless communication module being applied, and a second path configured to cause the electronic device to have a second radiation efficiency different from the first radiation efficiency based on a signal of the first frequency band is applied, and is connected to the second electrical component.

According to an example embodiment, the radio frequency switch may be configured to select a path providing higher radiation efficiency among the first radiation efficiency and the second radiation efficiency.

According to an example embodiment, the printed circuit board is configured to contact the multiple pads, and may include multiple first areas electrically isolated from the multiple pads, and a second area excluding the first areas.

According to an example embodiment, based on the first path being selected by the radio frequency switch, a first antenna time constant value is formed, and wherein based on the second path being selected by the radio frequency switch, a second antenna time constant value different from the first antenna time constant value is formed.

According to an example embodiment, the wireless communication module may be disposed on the printed circuit board surrounded by the shield can, and may be electrically connected to the shield can.

According to an example embodiment, the electronic device may further include a battery disposed adjacent to the printed circuit board, wherein the shield can is disposed between the printed circuit board and the battery.

According to an example embodiment, the shield can may include a shield plate and a sidewall extending vertically along an edge of the shield plate.

According to an example embodiment, the radio frequency switch may include multiple terminals.

According to an example embodiment, the multiple pads may be spaced apart from each other along an edge of the shield can.

According to an example embodiment, the multiple first areas may be recessed from one surface of the printed circuit board facing the multiple pads than the second area.

According to an example embodiment, the second area may include a second conductive layer, a first insulating layer disposed on the second conductive layer, and a first conductive layer disposed on the first insulating layer, and the multiple first areas may include the second conductive layer, and the first insulating layer disposed on the second conductive layer.

According to an example embodiment, the printed circuit board comprises: a second conductive layer disposed in the multiple first areas and the second area, a first insulating layer positioned on the second conductive layer and disposed in the multiple first areas and the second area, and a first conductive layer positioned on the first insulating layer and disposed in the second area and not disposed in the multiple first areas.

According to an example embodiment, the multiple pads may be electrically isolated from the first conductive layer.

According to an example embodiment, the radio frequency switch may be disposed adjacent to the multiple pads.

According to an example embodiment, the first electrical component may be configured to electrically connect the shield can to the printed circuit board.

According to an example embodiment, the printed circuit board may further include the third electronic component comprising circuitry electrically connected to the radio frequency switch, the radio frequency switch may further include a third path configured to cause the electronic device to have a third radiation efficiency based on a signal of the first frequency band being applied, and is connected to the third electronic component, and wherein based on the third path being selected by the radio frequency switch, a third antenna time constant value, different from the first antenna time constant value and the second antenna time constant value, is formed.

According to an example embodiment of the disclosure, an electronic device may include: a housing, a printed circuit board disposed in the housing, the printed circuit board including a wireless communication module comprising communication circuitry, a radio frequency switch, a first electronic component comprising circuitry, and a second electrical component comprising circuitry electrically connected to the radio frequency switch, and a shield can disposed on the printed circuit board to cover at least a partial area of the printed circuit board and including multiple pads in contact with the printed circuit board, wherein the multiple pads include a first pad electrically connected to the radio frequency switch and a second pad electrically connected to the first electronic component, wherein the multiple pads are configured to be electrically isolated from the printed circuit board.

According to an example embodiment, the radio frequency switch may be configured to select a path providing higher radiation efficiency, from a first path, in which a signal in a first frequency band provided from the wireless communication module provides first radiation efficiency, and a second path, in which a signal in the first frequency band is connected to the second electronic component to provide second radiation efficiency different from the first radiation efficiency.

According to an example embodiment, the printed circuit board may include a portion in contact with the multiple pads, and may include a first area electrically isolated from the multiple pads, and a second area excluding the first area.

According to an example embodiment, based on the radio frequency switch selecting the first path, a first antenna time constant value may be formed, and based on the radio frequency switch selecting the second path, a second antenna time constant value different from the first antenna time constant value may be formed.

According to an example embodiment, the wireless communication module may be disposed on the printed circuit board surrounded by the shield can, and may be electrically connected to the shield can.

At least a portion of the front of the housing 301 may be used as an antenna for an antenna function of the wearable electronic device 101. However, since the housing 301, which includes the exterior of the electronic device, cannot be modified after the design is finalized, an antenna length value for shifting antenna resonance to a desired band may not be adjusted. In addition, the wearable electronic device, by its very nature, is small in size, so low band antenna resonance may be formed at a frequency band lower than a typical LTE support band.

According to an embodiment of the disclosure, the shield can 330 may be used as an antenna length value adjustment factor, and the radio frequency switch 360 may be used to connect the antenna through multiple paths, and thus may be configured to select a path which provides the highest radiation efficiency, from among the multiple paths. Accordingly, antenna performance may be improved by adjusting an antenna length value, performance degradation due to parasitic components between the shield can 330 and the battery 320 may be prevented and/or reduced, and a broadband antenna may be realized by antenna resonance shifting.

What is claimed is:

1. An electronic device comprising:

a housing;

a printed circuit board disposed in the housing, the printed circuit board comprising a wireless communication module comprising communication circuitry, a radio frequency switch, a first electronic component comprising circuitry, and a second electronic component comprising circuitry electrically connected to the radio frequency switch;

a shield can disposed on the printed circuit board to cover at least a partial area of the printed circuit board and comprising multiple pads in contact with the printed circuit board; and an antenna module, including at least one antenna, configured to transmit and/or receive signals and/or power between external electronic devices using at least part of the housing and at least part of the shield can;

wherein the multiple pads comprise:

a first pad electrically connected to the radio frequency switch and electrically isolated from a ground of the printed circuit board; and a second pad electrically connected to the first electronic component and electrically isolated from the ground of the printed circuit board, and wherein the radio frequency switch is configured to select one of:

a first path configured to cause the antenna module to have a first radiation efficiency based on a signal of a first frequency band provided from the wireless communication module being applied to the first path; and a second path configured to cause the antenna module to have a second radiation efficiency different from the first radiation efficiency based on a signal of the first frequency band being applied to the second path, and is connected to the second electrical component.

2. The electronic device of claim 1, wherein the radio frequency switch is configured to select a path providing higher radiation efficiency between the first radiation efficiency and the second radiation efficiency.

3. The electronic device of claim 1, wherein the printed circuit board is configured to contact the multiple pads, and comprises:

multiple first areas electrically isolated from the multiple pads; and a second area.

4. The electronic device of claim 3, wherein the multiple first areas are recessed from one surface of the printed circuit board facing the multiple pads more than the second area.

5. The electronic device of claim 3, wherein the printed circuit board comprises:

a second conductive layer disposed in the multiple first areas and the second area;

a first insulating layer positioned on the second conductive layer and disposed in the multiple first areas and the second area; and a first conductive layer positioned on the first insulating layer and disposed in the second area and not disposed in the multiple first areas.

6. The electronic device of claim 5, wherein the multiple pads are electrically isolated from the first conductive layer.

7. The electronic device of claim 1, wherein based on the first path being selected by the radio frequency switch, a first antenna time constant value is formed, and wherein based on the second path being selected by the radio frequency switch, a second antenna time constant value different from the first antenna time constant value is formed.

8. The electronic device of claim 7, wherein the printed circuit board further comprises: a third electronic component, comprising circuitry, electrically connected to the radio frequency switch, wherein the radio frequency switch further comprises a third path configured to cause the antenna module to have a third radiation efficiency based on a signal of the first frequency band being applied to the third path, and is connected to the third electrical component, and wherein based on the third path being selected by the radio frequency switch, a third antenna time constant value, different from the first antenna time constant value and the second antenna time constant value, is formed.

9. The electronic device of claim 1, wherein the wireless communication module is disposed on the printed circuit board surrounded by the shield can, and is electrically connected to the shield can.

10. The electronic device of claim 1, further comprising a battery disposed adjacent to the printed circuit board, wherein the shield can is disposed between the printed circuit board and the battery.

11. The electronic device of claim 1, wherein the shield can comprises:

a shield plate; and a sidewall extending vertically along an edge of the shield plate.

12. The electronic device of claim 1, wherein the radio frequency switch comprises multiple terminals.

13. The electronic device of claim 1, wherein the multiple pads are spaced apart from each other along an edge of the shield can.

14. The electronic device of claim 1, wherein the radio frequency switch is disposed adjacent to the multiple pads.

15. The electronic device of claim 1, wherein the first electronic component is configured to electrically connect the shield can to the printed circuit board.

16. An electronic device comprising:

a housing;

a printed circuit board disposed in the housing, the printed circuit board comprising a wireless communication module comprising communication circuitry, a radio frequency switch, a first electronic component comprising circuitry, and a second electronic component, comprising circuitry, electrically connected to the radio frequency switch; and a shield can disposed on the printed circuit board to cover at least a partial area of the printed circuit board and comprising multiple pads in contact with the printed circuit board; and an antenna module, comprising at least one antenna, configured to transmit and/or receive signals and/or power between external electronic devices using at least part of the housing and at least part of the shield can;

wherein the multiple pads comprise:

a first pad electrically connected to the radio frequency switch and electrically isolated from a ground of the printed circuit board; and a second pad electrically connected to the first electronic component and electrically isolated from the ground of the printed circuit board.

17. The electronic device of claim 16, wherein the radio frequency switch is configured to select a path providing higher radiation efficiency, between:

a first path configured to cause the antenna module to have a first radiation efficiency based on a signal of a first frequency band provided from the wireless communication module being applied to the first path;

and a second path configured to cause the antenna module to have a second radiation efficiency different from the first radiation efficiency based on a signal of the first frequency band being applied to the second path.

18. The electronic device of claim 17, wherein based on the first path being selected by the radio frequency switch, a first antenna time constant value is formed, and wherein based on the second path being selected by the radio frequency switch, a second antenna time constant value different from the first antenna time constant value is formed.

19. The electronic device of claim 16, wherein the printed circuit board is configured to contact with the multiple pads, and comprises:

a first area electrically isolated from the multiple pads, and a second area.

20. The electronic device of claim 16, wherein the wireless communication module is disposed on the printed circuit board surrounded by the shield can, and is electrically connected to the shield can.

* * * * *